United States Patent [19]

Okumura

[11] Patent Number: 4,935,380
[45] Date of Patent: Jun. 19, 1990

[54] METHOD FOR MANUFACTURING SEMICONDUCTOR DEVICE

[75] Inventor: Yoshinori Okumura, Hyogo, Japan

[73] Assignee: Mitsubishi Denki Kabushiki Kaisha, Tokyo, Japan

[21] Appl. No.: 227,892

[22] Filed: Aug. 3, 1988

[30] Foreign Application Priority Data

Aug. 4, 1987 [JP] Japan .................. 62-195687
Aug. 5, 1987 [JP] Japan .................. 62-196850
Aug. 6, 1987 [JP] Japan .................. 62-198462

[51] Int. Cl.$^5$ .......................................... H01L 21/00
[52] U.S. Cl. .................................. 437/44; 437/40;
437/43; 437/49; 437/193; 437/200; 437/982
[58] Field of Search .............. 437/49, 43, 40, 193, 437/200, 982, 44, 41

[56] References Cited

U.S. PATENT DOCUMENTS 4,332,207 7/1986 Levinstein et al. ............. 437/200
4,782,037 11/1988 Tomozawa et al. ............. 437/200

FOREIGN PATENT DOCUMENTS 0190928 8/1986 European Pat. Off. .
0224199 6/1987 European Pat. Off. ............ 437/40
2943150 5/1980 Fed. Rep. of Germany ...... 437/200
0135767 8/1984 Japan ................................ 437/29

OTHER PUBLICATIONS

B. Crowder and S. Zirinsky, "1 um MOSFET VLSI Technology: Part VII-Metal Silicide Interconnection Technology-A Future Perspective" IEEE Transactions on Electron Devices, vol. ED-26, No. 4 (Apr. 1979): 369, 371.

P. Tsang et al., "Fabrication of High-Performance LDDFET's with Oxide Sidewall-Spacer Technology", IEEE Transactions on Electron Devices, vol. ED-29, No. 4 (Apr. 1982): 590, 596.

Primary Examiner—Brian E. Hearn
Assistant Examiner—Tuan Nguyen
Attorney, Agent, or Firm—Lowe, Price, LeBlanc, Becker & Shur

[57] ABSTRACT

A polyside gate of a prescribed shape with a protection film formed on the upper surface thereof is formed on a main surface of a semiconductor substrate. The protection film protects the upper surface of the polyside gate from oxidation in heat treatment. Impurities are implanted in the semiconductor substrate using the polyside gate and the protection film as a mask. The implanted impurities are diffused in the semiconductor substrate by the heat treatment, thereby providing a MOS transistor. A polyside gate of a prescribed shape is formed on a main surface of a semiconductor substrate and an interlayer insulating film is formed to cover the polyside gate. A protection film is formed on the interlayer insulating film and a reflow film is further formed thereon. The protection film protects the polyside gate from oxidation. The surface of the reflow film is made smooth by the heat treatment.

25 Claims, 12 Drawing Sheets

METHOD FOR MANUFACTURING SEMICONDUCTOR DEVICE

BACKGROUND OF THE INVENTION

1. Field of the Invention

The present invention generally relates to a method for manufacturing semiconductor devices, and more specifically to a method for manufacturing a semiconductor device including a control electrode of a field effect transistor, wires formed on a semiconductor substrate and the like.

2. Description of the Prior Art

FIG. 1 is a block diagram showing one example of a typical DRAM structure, and FIG. 2 is an equivalent circuit diagram of one memory cell arranged in the memory cell array of FIG. 1.

The structure will be briefly described with reference to the figures. A plurality of word lines 110 and a plurality of bit lines are arranged in the memory cell array 101 and memory cells each comprising a MOS transistor 108 and a capacitor 109 are connected to the intersections. The selection of the memory cell is effected based on a word line and a bit line selected by a X address buffer·decoder 102 and a Y address buffer·decoder 103, respectively. The instruction for writing/reading data to and from the memory cell is effected by a signal (R/W) applied to a R/W control circuit 104. In reading, the data stored in the selected memory cell is detected by a sense amplifier 105, amplified therein, and is outputted externally as an output data (Dout) through a data output buffer 106.

FIG. 3 is a plan view showing a portion of the memory cell array shown in FIG. 1 and FIG. 4 is a cross sectional view taken along the line IV—IV of FIG. 3. The structure will be described in the following with reference to the figures.

A region for isolating devices is formed on a semiconductor substrate 1 by an ion diffused layer 2 having the same conductivity type as the substrate 1 and a thick oxide film 3. An ion diffused layer 4 having the conductivity type opposite to that of the semiconductor substrate 1 for forming a direct contact, a storage node 5 formed of a material of polycrystalline silicon (polysilicon) system for storing charges and a cell plate electrode 6 formed of a material of polysilicon system form a capacitor region.

A transfer gate electrode 7 formed of a single layer of polysilicon, two layers of polysilicon and a metal having high melting point or a single layer of a metal having high melting point, and an ion diffused layer 8 (8a, 8b, 8c) having a conductivity type opposite to the semiconductor substrate 1 for forming source/drain regions form a transfer gate transistor region. An interlayer insulating film 14 formed of an oxide film is formed to cover the capacitor region and the transfer gate transistor region. A contact hole 9 is formed in the interlayer insulating film 14 to provide contact with the ion diffused layer 8b.

A bit line 10 formed of two layers of polysilicon and a metal having high melting point or of a metal having high melting point is formed on the interlayer insulating film 14 so as to be connected with the ion diffused layer 8b through the contact hole 9. A thin insulating film 11 having multilayer structure of an oxide film and a nitride film is formed between the storage node 5 and the cell plate electrode 6, and an insulating film 12 formed of an oxide film is formed below the transfer gate electrode 7.

FIG. 5 shows a cross sectional structure of a field effect transistor having LDD (Lightly Doped Drain/Source) structure.

The structure will be described in the following with reference to the figure. An active region is formed on a semiconductor substrate 21 by ion diffused layers 23a and 23b having the same conductivity type as the substrate and by thick oxide films 22a and 22b. Impurity regions 24a and 24b having the opposite conductivity type is formed on a main surface of the semiconductor substrate in the active region. Impurity regions 25a and 25b having high impurity concentration are connected respectively to the impurity regions 24a and 24b, thereby forming the LDD structure. A gate electrode 28 is formed on the main surface of the semiconductor substrate between the impurity regions 25a and 25b, with a gate oxide film 27 interposed therebetween. An interlayer insulating film 26 is formed on the entire surface of the active region to cover the gate electrode 28. Metal interconnections 30, 29 formed on the interlayer insulating film 26 are respectively connected to the impurity region 24b and the gate electrode 28 through contact holes 31, 32 formed on the interlayer insulating film 26.

The above described LDD structure has been developed to prevent the disadvantages of short channel effect in the transistor incidental to the recent high integration of the semiconductor devices. The manufacturing method thereof has been more complicated.

As the wafer size has become larger, and the devices have become smaller and come to be implemented in higher integration, various problems, which were not so important, have become serious. One of these problems is a thermal influence caused by the heat treatment in the manufacturing process, and therefore it is desired to carry out the manufacturing process in lower temperature. In addition, it is strongly desired to improve the speed of operation of the devices, and the electrodes and wires are required to have lower resistance in order to attain the high speed operation. A new manufacturing process and technique as well as the improvement and development of the device structure should be established sooner.

FIGS. 6A to 6E are schematic cross sectional views showing the steps of manufacturing a conventional field effect transistor. The manufacturing method will be described with reference to the figures.

First, a thin silicon oxide film 202 is formed on a main surface of a P type semiconductor substrate 201 by thermal oxidation method and the like, and thereafter, a polycrystalline silicon film 204 is formed by CVD method and the like. After the resistance of the polycrystalline silicon film 204 is lowered by phosphorus treatment or the like, a silicide film 205, for example, a tungsten silicide ($WSi_2$) film, is formed by sputtering and the like (FIG. 6A).

Thereafter, the said silicide film 205 and the polycrystalline silicon film 204 are patterned by photolithography, and a gate electrode 203 having polyside structure is formed on the gate oxide film 202 (FIG. 6B).

Next, ion implantation 206 of for example arsenic ions is carried out under a prescribed implantation condition from the side of the main surface of the said substrate 201, whereby an N type impurity region 207 is formed on a main surface of the said substrate 201 on both sides of the said gate electrode 203, with the gate electrode serving as a mask (FIG. 6C). Thereafter, heat treatment is carried out at about 900° C. for 60 minutes, for example, whereby the said N type impurity region 207 becomes the source region 208a and a drain region 208b of N type diffused region. A portion between these two regions serves as a channel portion, thereby forming a MOS transistor.

Thereafter, an insulating film 209 is formed by the CVD method and the like on the said substrate 201 to cover the said gate electrode 203, and thereafter, a reflow film 210, for example BPSG (boron.phosphorus.silicate glass) is formed thereon (FIG. 6D). In this state, the upper surface becomes concave on the upper portion of the said gate electrode 203 to have a steep step. The step portion affects wires formed thereon in the later steps as shown in FIG. 5 such as disconnection and the like, so that some measures should be taken to solve the problem of the step portion.

Thereafter, reflow oxidation is carried out in wet atmosphere at about 900° C. for 30 minutes, for example, whereby the said reflow film 210 is made a flat film 210a with the upper surface made smooth (FIG. 6E). Although not shown, patterning by photolithography is carried out to form contact holes in the said flat film 210a and the insulating film 209. Thereafter, interconnection film, for example an aluminum film is formed on the entire surface and patterning by photolithography is carried out. Consequently, upper layer interconnections formed of aluminum interconnections is formed on the said flat film 210a, the interconnection connected to the said gate electrode 203 and the like through the contact holes (see FIG. 5).

The said semiconductor device is obtained through the above described manufacturing process. The following phenomenon occurs in the manufacturing steps. Namely, in the first heat treatment after the ion implantation 206, an oxidation reaction occurs to generate an oxide film on a main surface of the said gate electrode 203. More specifically, the said gate electrode 203 is directly exposed to the heat treatment space, and an oxide film is generated on the upper layer portion of the said gate electrode 203 by the reaction with the oxygen in the space. If the said silicide film 205 is formed of tungsten silicide, the oxide film formed on a main surface of the said gate electrode 203, namely, on the main surface of the said silicide film 205, is an oxide film or a silicon oxide film such as tungsten dioxide ($WO_2$), tungsten trioxide ($WO_3$), or the like. On this occasion, the said silicide film 205 is rich in oxygen being exposed to the heat treatment space. On the contrary, the polycrystalline silicon film 204 which is the source of silicon is under the said silicide film 205. Therefore, the growth of the said silicon oxide film is rate-determined by the amount of silicon supplied through the said silicide film 205 by thermal diffusion.

During the oxidation process, the crystallization of the silicide takes place in the said silicide film 205. The said silicide begins to crystallize gradually when a prescribed temperature is exceeded, and the larger the diameter of the crystal grain becomes, the larger the grain boundary becomes.

Meanwhile, the said generated oxide film has a porous structure, so that it allows diffusing oxygen to pass therethrough. The said silicide film 205 has a large grain boundary, so that it allows the passage of silicon. Namely, these films do not prevent the gradual generation of the said oxide film.

In the second heat treatment in reflow oxidation, an oxidation reaction occurs in which a silicon oxide film 211 is further formed on the generated oxide film on the main surface of the said silicide film 205. More specifically, silicon is thermally diffused through the said silicide film 205 to the upper layer side from the said polycrystalline silicon film 204. Oxygen is thermally diffused through the reflow film 210 and through the insulating film 209 from the heat treatment space to the side of the said gate electrode 203. When the silicon and the oxygen reach the said generated oxide film, they are coupled to each other to generate a silicon oxide film 211. On this occasion, the said silicide film 205 is rich in silicon because much silicon is supplied from the said polycrystalline silicon film 204 therebelow. On the contrary, the oxygen should be thermally diffused through the insulating film 209 and the reflow oxide film 10 on the said generated oxide film. Therefore, the growth of the said silicon oxide film 211 is rate-determined by the amount of supplied oxygen. Since the said silicon oxide film 211 has a porous structure, it allows the passage of silicon, so that it does not prevent the gradual generation of the said silicon oxide film 211.

Although the above described phenomenon is incidental to the said first and second heat treatment, these heat treatments are essential in the process of manufacturing semiconductor devices. The said first heat treatment is to recover the damage of the impurity region 207 to which prescribed ions are implanted, and to provide a prescribed diffused region. The said second heat treatment is to make flat the said reflow film 210 prior to the formation of the upper layer interconnections so as to make smooth and small the step at the interlayer insulating portion, thereby preventing this connection or short circuit of the said upper layer interconnections at the step portion and enabling processing of high precision.

Since a conventional semiconductor device is manufactured in the above described manner, the gate electrode 203 is subjected to the oxidation reaction through the steps of heat treatment and is affected by the reaction.

More specifically, the oxide film generated on the silicide film 205 of the said gate electrode 203 through the first heat treatment causes degradation of electrical characteristics such as increase of the sheet resistance of the gate, increase of the contact resistance when it is connected to the upper layer, and the like.

The silicon oxide film 211 formed in the second heat treatment grows as the processing time passes and becomes thick. On the contrary, the silicon in the polycrystalline silicon film 204 which is the source of silicon supply for generating the said silicon oxide film 211 gradually decreases. When the said second heat treatment is completed, the said gate electrode 203 has its main surface bent in a concave shape as shown in FIG. 6E. If this bent grow worse, the degradation of the shape possibly occurs, such as the separation of the said silicide film 205 and the polycrystalline silicon film 204 at the junction surface. As a result, the degradation of the characteristics of the transistor such as fluctuation of the threshold voltage, decrease of the gate breakdown voltage and so on possibly occurs.

As described above, either of the heat treatments cause degradation of the electric characteristics. Especially, the influence of the degradation over the shape is serious, considerably lowering the reliability.

SUMMARY OF THE INVENTION

An object of the present invention is to provide a method for manufacturing reliable semiconductor devices.

Another object of the present invention is to provide a method for manufacturing semiconductor devices having superior electric characteristics.

A further object of the present invention is to provide a method for manufacturing semiconductor devices in which the shape of the device is not changed during manufacturing.

A still further object of the present invention is to provide a method for manufacturing semiconductor devices enabling stable heat treatment.

A still further object of the present invention is to provide a method for manufacturing semiconductor devices in which the temperature of the heat treatment need not be lowered.

In order to attain the above described objects, the method for manufacturing a semiconductor device in accordance with the present invention comprises the steps of: preparing a semiconductor substrate having a main surface; forming a conductor including polysilicon on the main surface of the said semiconductor substrate; forming a protection film for protecting the conductor from oxidation; and performing heat treatment with oxidation on the semiconductor substrate.

In a certain aspect, the method for manufacturing semiconductor devices in accordance with the present invention comprises a first step of preparing a semiconductor substrate; a second step of forming a polyside gate; a third step of forming a protection film; a fourth step of implanting impurities; and a fifth step of diffusing impurities. In the first step, a semiconductor substrate having a main surface is prepared. In the second step, a polyside gate having a prescribed shape is formed on the main surface of the semiconductor substrate. In the third step, a protection film which protects the upper surface of the polyside gate from oxidation in heat treatment is formed on the polyside gate. In the fourth step impurities are implanted in the semiconductor substrate using the polyside gate and the protection film as masks. In the fifth step, the implanted impurities are diffused in the semiconductor substrate by heat treatment.

In another aspect, the method for manufacturing a semiconductor device in accordance with the present invention comprises a first step of preparing a semiconductor substrate; a second step of forming a polyside gate; a third step of forming an interlayer insulating film; a fourth step of forming a protection film; a fifth step of forming a reflow film; and a sixth step of heat treating. In the first step, a semiconductor substrate having a main surface is prepared. In the second step, a polyside gate having a prescribed shape is formed on the main surface of the semiconductor substrate. In the third step, an interlayer insulating film is formed on the main surface of the semiconductor substrate to cover the polyside gate. In the fourth step, a protection film which protects the polyside gate from oxidation is formed on the interlayer insulating film. In the fifth step, a reflow film for moderating the step at the interlayer insulating film is formed on the protection film. In the sixth step, the surface of the reflow film is made smooth by the heat treatment.

In the method for manufacturing a semiconductor device comprising the above described steps, the electrical characteristics is not changed by the heat treatment, whereby a reliable semiconductor device can be provided. In addition, the manufacturing method enables stable heat treatment which does not cause the change of shapes in heat treatment.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross sectional view taken along the line IV—IV of FIG. 3, showing the cross sectional structure of the transfer gate, capacitor and the like;

DESCRIPTION OF THE PREFERRED EMBODIMENTS

FIGS. 7A to 7E are schematic cross sectional views showing the steps of the manufacturing method in accordance with one embodiment of the present invention.

The manufacturing method will be described in the following with reference to the figures.

Figure 7A:
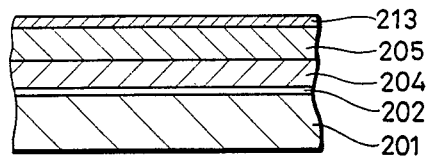
FIGS. 7A to 7E are schematic cross sectional views showing the steps of the manufacturing method in accordance with one embodiment of the present invention.

First, a thin silicon oxide film 202 which could be a gate oxide film 202a is formed on a main surface of a P type semiconductor substrate 201 by thermal oxidation method or the like. Thereafter, a first polycrystalline silicon layer 204 is formed to be about 3000 Å in thickness by CVD method or the like, and thereafter the resistance thereof is lowered by phosphorus treatment or the like. Thereafter, a silicide layer 205, for example a tungsten silicide ($WSi_2$) layer, is formed by sputtering or the like to the thickness of about 2300 Å, and a second polycrystalline silicon layer 213 is formed by the CVD method or the like to the thickness of about 500 Å (FIG. 7A).

Figure 7B:
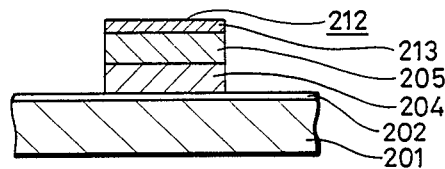

Thereafter, the second polycrystalline silicon layer 213, the silicide layer 205 and the first polycrystalline silicon layer 204 are patterned by photolithography, whereby a gate electrode 212 is formed having a portion of the said second polycrystalline silicon layer 213 in the upper layer portion thereof (FIG. 7B).

Figure 7C:
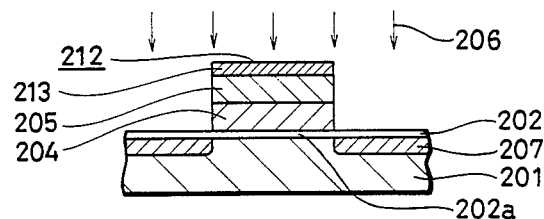

Thereafter, ion implantation 206 of for example arsenic ions is carried out under a prescribed implantation condition from the side of the main surface of the said substrate 201. N type impurity layers 207 are formed on the regions of the main surface of the said substrate 201 which regions are on both sides of the said gate electrode 212 serving as a mask (FIG. 7C). Thereafter, heat treatment is carried out at about 900° C. for 60 minutes, for example, whereby the said N type impurity layers 207 become N type diffused layers to be the source region 208a and the drain region 208b, respectively. The portion on the main surface of the said substrate 201 between the source region 208a and the drain region 208b becomes a channel portion, whereby a MOS transistor is formed.

Figure 7D:
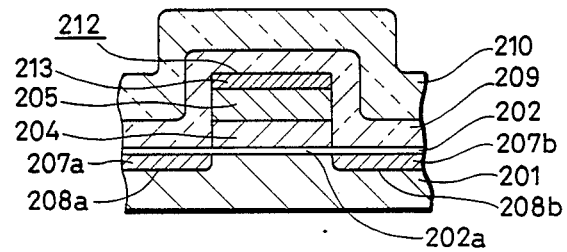

Next, an insulating film 209 formed of a silicon oxide film is formed by the CVD method or the like to the thickness of about 2000 Å on the entire surface of the main surface of the substrate 201 to cover the said gate electrode 212. A reflow material, for example, BPSG 210 for making smooth the interlayer insulating layer is formed by CVD method or the like to the thickness of about 8000 Å on the insulating film 209 (FIG. 7D).

Figure 1:
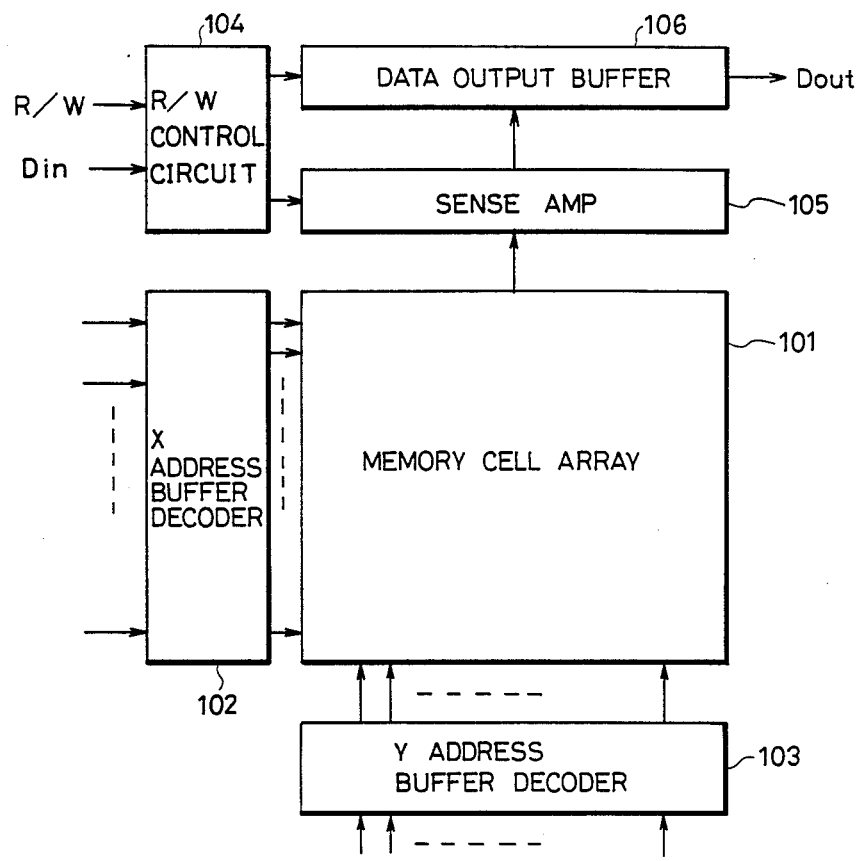
FIG. 1 is a block diagram showing an example of a general DRAM structure, showing the structure of a memory cell array and the surroundings thereof.
Figure 2:
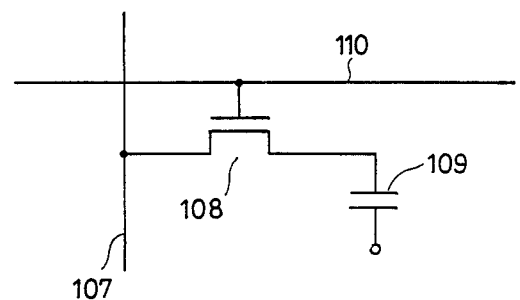
FIG. 2 is an equivalent circuit diagram of one memory cell arranged in the memory cell array of FIG. 1.
Figure 3:
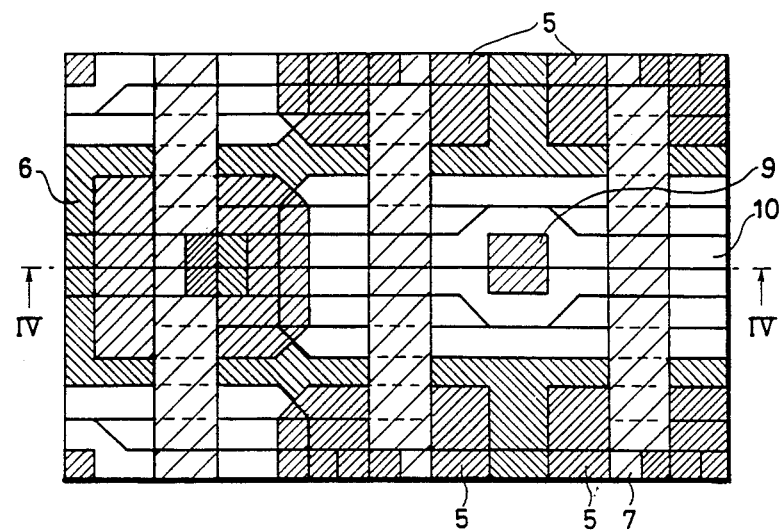
FIG. 3 is a plan view showing a portion of the memory cell array of FIG. 1.
Figure 4:
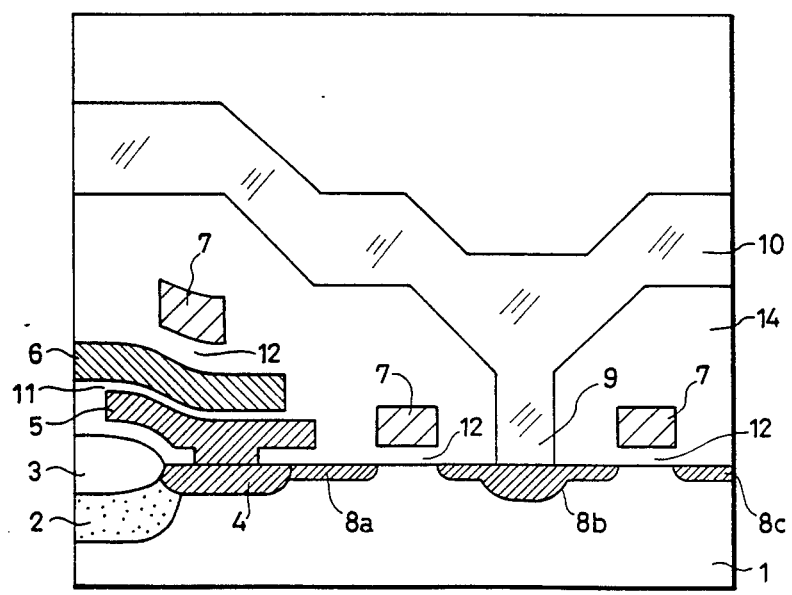
Figure 5:
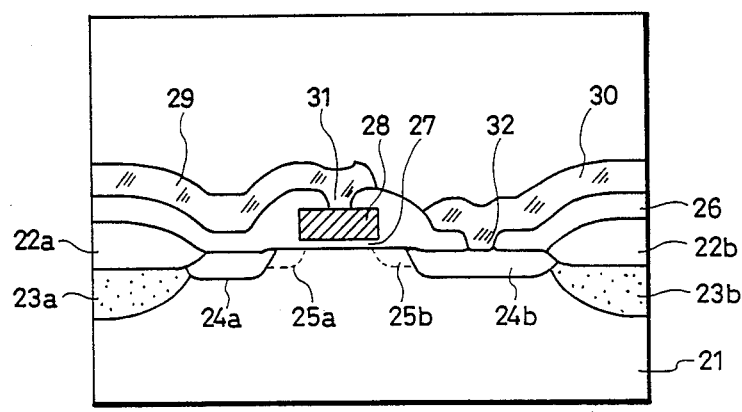
FIG. 5 is a cross sectional view of a field effect transistor having LDD structure, showing the characteristics of the structure of the impurity region in the active region.
Figure 6A:
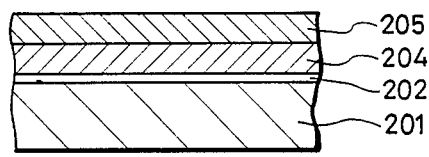
FIGS. 6A to 6E are schematic cross sectional views showing the steps of manufacturing a conventional field effect transistor.
Figure 6B:
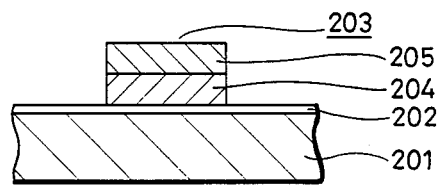
Figure 6C:
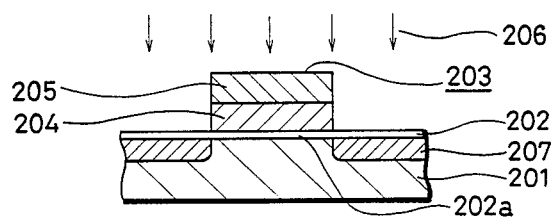
Figure 6D:
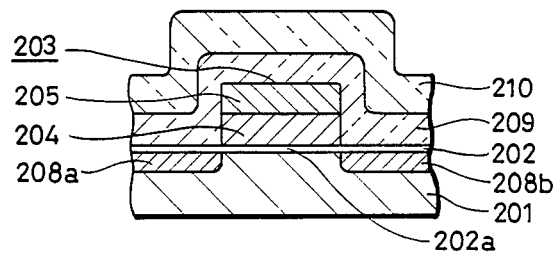
Figure 6E:
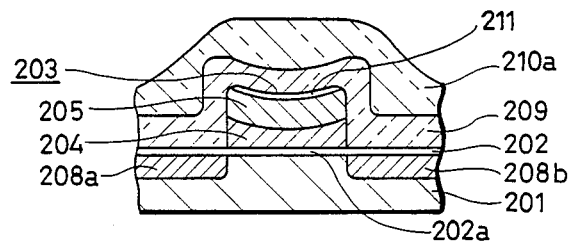
Figure 7E:
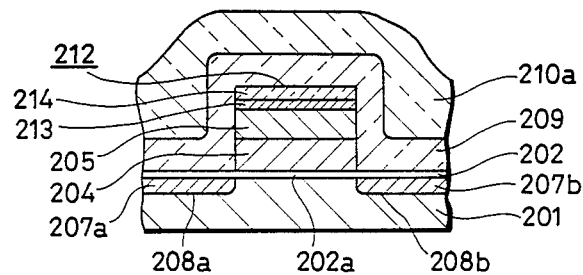

Reflow oxidation is carried out on the said BPSG 210 at about 900° C. for 30 minutes in a wet atmosphere, thereby providing a flat BPSG 210a (FIG. 7E). Thereafter, as in the conventional method, patterning by photolithography is carried out to form contact holes at prescribed portions in the said flat BPSG 210a and the insulating layer 209 (not shown). Interconnection materials, for example, an aluminum film is formed on the entire upper surface, patterning by photolithography is carried out to form upper layer interconnections (not shown) of aluminum interconnections on the flat BPSG 210a, which interconnections connected to a main surface of the said gate electrode 212, source region 208a, drain region 208b and the like through the contact holes. The upper layer interconnections corresponds to the interconnection such as bit lines in the memory cell array shown in FIG. 1. The formation of said BPSG 210 and the reflow oxidation thereof is to minimize the steep step at the said insulating layer 209 generated by the said gate electrode 212 by making flat the said BPSG 210 prior to the formation of the said upper interconnections. By doing so, the disconnection or short circuit of the said upper layer interconnections at the step portion can be prevented and the processing at high precision can be made easier.

According to the above described one embodiment, a second polycrystalline silicon layer 213 capable of being stable is provided at a main surface of the gate electrode 212. Therefore, in the heat treatment after the ion implantation 206, the main surface of the said gate electrode 212 is not directly exposed to the heat treatment space, whereby it is protected from the heat treatment. In addition, in the heat treatment of reflow oxidation, the gate electrode 212 is also protected. Namely, in the former heat treatment, the oxygen from the heat treatment space reacts with the silicon in the said polycrystalline silicon layer 213 at first. In the latter heat treatment, the oxygen thermally diffused toward the gate electrode 212 through the insulating layer 209 and the BPSG 210 first reacts with the silicon in the said second polycrystalline silicon layer 213. By this reaction, the said second polycrystalline silicon layer 213 turns to be a silicon oxide film 214 from the upper portion thereof. In the above described heat treatment, the reaction leaves the said second polycrystalline silicon layer 213 of about 100 to 200 Å thickness. Therefore, the reaction is carried out only on the second polycrystalline silicon layer 213 at the upper layer of the said gate electrode 212, and not with the first polycrystalline silicon layer 214 forming the lower layer portion of the said gate electrode 212. A main surface of the silicide layer 205 forming the upper layer portion of the gate electrode 212 is in contact with the said second polycrystalline silicon layer 213 and no oxygen is diffused thereto, so that there will be no oxide of a metal having high melting point generated therein. Therefore, the upper layer interconnections are directly connected to the silicide layer 205, providing the desired characteristics. As described above, the said gate electrode 212 is free from the influence of the oxidation in heat treatment and is protected from the heat treatment, whereby the shape thereof can be maintained properly.

FIGS. 8A to 8E are schematic cross sectional views showing the manufacturing method in accordance with another embodiment of the present invention.

Figure 8A:
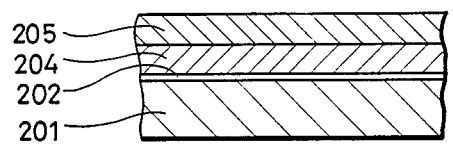
FIG. 8A to 8E are schematic cross sectional views showing the steps of the manufacturing method in accordance with another embodiment of the present invention.
Figure 8B:
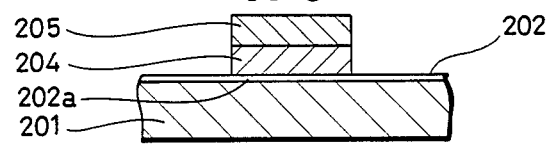
Figure 8C:
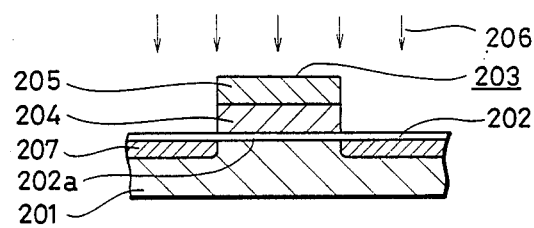

The manufacturing method will be described in the following with reference to the figures. Since the steps shown in FIGS. 8A to 8C are the same as the above described embodiment, the description thereof will be omitted. The lower layer portion of the gate electrode 212 is formed to have the thickness of about 3000 Å while the upper layer portion thereof is formed to have the thickness of about 2300 Å.

Figure 8D:
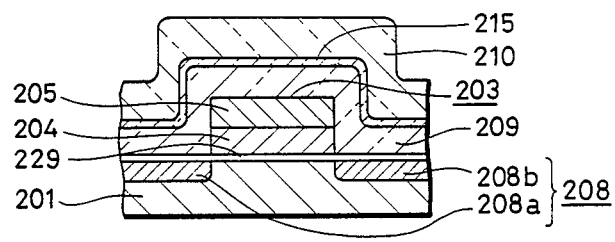

An insulating film 209 formed of for example silicon oxide film which covers a main surface of a substrate 201 together with the gate electrode 203 is formed by the CVD method or the like to the thickness of about 2000 Å. Thereafter, a thin polycrystalline silicon film 215 is formed on the insulating film 209 by the CVD method or the like to the thickness of about 300 Å, and, in addition, a reflow film 210 of for example BPSG is formed thereon (FIG. 8D). In this state, the upper surface of the said reflow film 210 has a convex shape at the upper portion of the gate electrode 203 with a steep step.

Figure 8E:
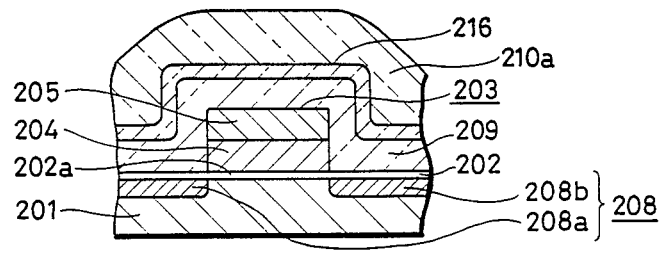

Thereafter, the second heat treatment of reflow oxidation is carried out at about 900° C. for 30 minutes in the wet atmosphere, for example, whereby the said reflow film 210 is made a flat film 210a with the upper surface made smooth and flat. At the same time, the polycrystalline silicon film 215 reacts with the oxygen thermally diffused through the said reflow film 210, whereby the film 215 entirely turns into a silicon oxide film 216 to be integrated with the said insulating film 209 (FIG. 8E). Thereafter, the upper layer interconnections of aluminum interconnection are formed in the same manner as in the prior art.

According to this embodiment, after the insulating film 209 is formed on the gate electrode 203, a thin polycrystalline silicon film 215 is formed and a reflow film 210 is formed to be reflow oxidized. Therefore, the oxygen thermally diffused toward the said gate electrode 203 through the said reflow film in the said heat treatment of the reflow oxidation first reaches the polycrystalline silicon film 215 and reacts with the silicon therein. Then, the polycrystalline silicon 215 turns to the silicon oxide film 216 gradually from the upper layer portion thereof. After the reflow oxidation, the polycrystalline silicon film 215 of about 300 Å in thickness completely turns to the silicon oxide film 216, and is integrated with the insulating film 209 to form an interlayer insulating portion. On this occasion, the thickness of the turned silicon oxide film 216 is larger than that before the change, however, it is not so thick to cause any problems. As described above, the oxidation reaction is carried out only in that layer 215 and has no influence to the lower layers, so that the oxidation reaction with the said gate electrode 203 is suppressed and the electrode is protected. Therefore, the said gate electrode 203 is formed to have a desired shape and provides the desired characteristics, whereby a transistor having superior electric characteristics can be provided. Meanwhile, in the first heat treatment after the ion implantation 206, a thin oxide film is formed on a main surface of the said gate electrode 203. However, in forming contact holes to connect the upper layer interconnections, by slightly etching the main surface of the said gate electrode 203 by reactive ion etching (hereinafter referred to as RIE), a proper connection is enabled and desired characteristics can be provided.

In the description of the above described two embodiments, N type diffused regions are formed on a P type substrate 201 to form a MOS transistor: however, the structure of the device is not limited to this. The substrate 201 and the diffused regions may have the opposite conductivity type, and the devices to be formed may have any structure such as a bipolar transistor and the like.

Although the conductor portion is a gate electrode of the MOS transistor, the present invention may be applied to other electrodes or interconnections.

In addition, a polycrystalline silicon film is employed as the semiconductor film formed on the conductor portion, the film may be doped or non-doped polycrystalline silicon film and it may be an amorphous silicon film. Although the said semiconductor film is formed to have the thickness of about 300 Å to be entirely turned into the silicon oxide films 214, 216 after the reflow oxidation, it is not limited to this. Any thickness may be available provided that the said semiconductor film entirely turns into the silicon oxide film 214, 216 in accordance with the heat treatment condition, the oxidation reaction has no influence to the said gate electrode 203, and that the thickness of other films are properly selected, to provide the same effect as the foregoing.

FIG. 9A to 9G are schematic cross sectional views showing the manufacturing method of a transistor having LDD structure in accordance with a further embodiment of the present invention.

The manufacturing method will be described in the following with reference to the figures.

Figure 9A:
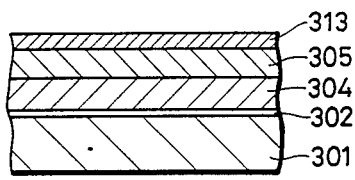
FIGS. 9A to 9G are schematic cross sectional views showing the steps of the manufacturing method in accordance with a further embodiment of the present invention.

First, a thin silicon oxide film 302 which could be a gate oxide film 302a is formed on a main surface of a P type semiconductor substrate 301 by thermal oxidation method or the like. Thereafter, a first polycrystalline silicon layer 304 is formed by the CVD method or the like to the thickness of about 3000 Å and the resistance thereof is lowered by phosphorus treatment or the like. A silicide layer 305, for example a tungsten silicide (WSi$_2$) layer is formed by sputtering method or the like to the thickness of about 2300 Å. In addition, a second polycrystalline silicon layer 313 is formed by the CVD method or the like to the thickness of about 500 Å (FIG. 9A).

Figure 9B:
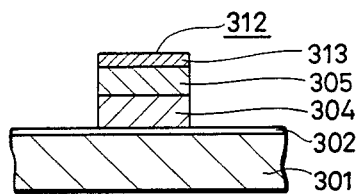

Thereafter, the said second polycrystalline silicon layer 313, the silicide layer 305 and the first polycrystalline silicon layer 304 are patterned by photolithography, whereby a gate electrode 312 comprising two layers of polyside structure with the said second polycrystalline silicon layer 313 at the upper layer is formed (FIG. 9B).

Figure 9C:
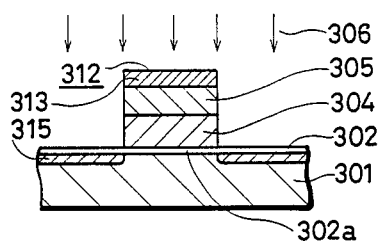

Thereafter, ion implantation 306 of for example arsenic ions is carried out under a prescribed implantation condition from the side of the main surface of the said substrate 301 with the gate electrode 312 serving as a mask, whereby first N type impurity layers 315 having shallow junctions are formed on both sides of the channel portion on the said substrate 301 (FIG. 9C). Thereafter, heat treatment is carried out, whereby the said first N type impurity layers 315 are turned to N$^-$ regions 315a, 315b which will be the source region and the drain region.

Figure 9D:
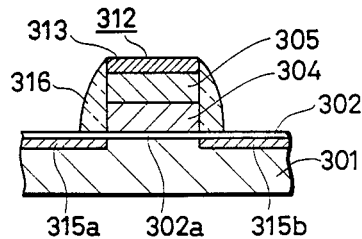

Thereafter, a silicon oxide film which will be a portion of the insulating layer is formed by the CVD method or the like entirely on the main surface of the said substrate 301 to the thickness of about 2500 Å, and thereafter the said silicon oxide film are entirely etched by RIE method or the like. Consequently, the said silicon oxide film remains only on the sides of the said gate electrode 312 and the second polycrystalline silicon layer 313, thereby forming a side wall 316 of the said silicon oxide film (FIG. 9D). The length of the bottom portion of the side wall 316 is about 2500 Å or less.

Figure 9E:
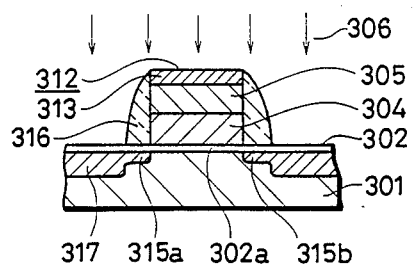

Thereafter, ion implantation 306 of for example arsenic ions is carried out from the main surface side of the said substrate 301 under the implantation condition enabling higher concentration and deeper junction than the said first N type impurity layer 315. The gate electrode 312 and the side wall 316 serve as masks and second N type impurity layers 317 are formed on the region outside the side wall 316 on the main surface of the substrate 301 (FIG. 9E). Thereafter, heat treatment is carried out at about 900° C. for 60 minutes, for example, whereby the said second N type impurity layers 317 are turned to N type diffused layers, whereby N$^+$ regions 317a and 317b are formed. In this manner, the source region 318a and the drain region 318b of LDD structure formed of the said N$^-$ regions 315a, 315b and N$^+$ regions 317a, 317b are formed sandwiching the channel portion on the main surface of the said substrate 301.

Figure 9F:
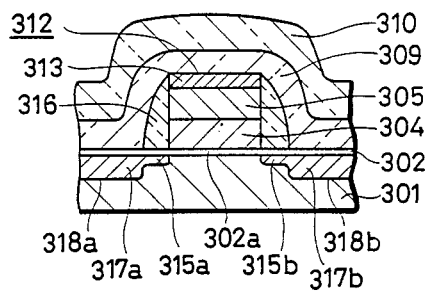

An insulating layer 309 of silicon oxide film is formed by the CVD method or the like to the thickness of about 2000 Å entirely over the main surface of the said substrate 301. A reflow material for flattening the interlayer insulating film, for example BPSG 310 is formed by the CVD method or the like to the thickness of about 8000 Å (FIG. 9F).

Figure 9G:
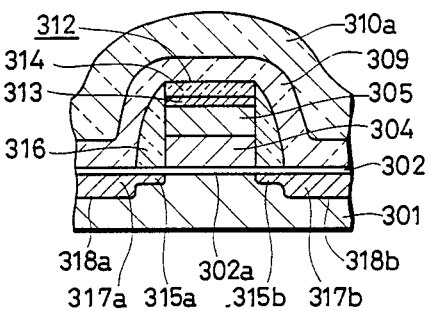

The reflow oxidation is carried out on the said BPSG 310 at about 900° C. for 30 minutes in the wet atmosphere, for example, to provide a flat BPSG 310a (FIG. 9G).

Thereafter, steps similar to the prior art are carried out, and upper layer interconnections are formed on the said flat BPSG 310.

In this embodiment also, the second polycrystalline silicon layer 313 is provided on the upper layer of the gate electrode 312. Therefore, the oxygen directly come from the heat treatment space or thermally diffused to the gate electrode 312 through the BPSG 310 and through the insulating layer 309 first reaches the said second polycrystalline silicon layer 313 to be coupled with the silicon. The polycrystalline silicon layer 313 gradually turns into the silicon oxide film 314 from the upper layer portion thereof.

In the above described heat treatment, so long as the said second polycrystalline silicon 313 exists, the reaction proceeds only in this region. In this case, the said second polycrystalline silicon layer 313 remains to the thickness of about 100 to 200 Å, and a silicon oxide film 314 which is derived from the reaction of the upper layer portion with oxygen grows. Therefore, in this case, the said oxygen will not be further thermally diffused to the side of the gate electrode 312. Therefore, the oxygen does not react with the first polycrystalline silicon layer 304 in the said gate electrode 312. In addition, there will be no reaction of generating oxide with the metal having high melting point in the metal silicide layer 305 having high melting point. Therefore, the said gate electrode 312 is free from and protected from the oxidation.

In reactive ion etching for forming side walls 316, the second polycrystalline silicon layer 313 also serves to prevent the said gate electrode 312, especially a main surface of the silicide layer 305 from being exposed directly to the etching space to react with the gas.

As described above, according to this embodiment, the silicon in the first polycrystalline silicon layer 304 in the gate electrode 312 is prevented from reacting with the oxygen provided by the heat treatment. Therefore, the said gate electrode 312 can be properly connected to the upper layer interconnections and the like. In addition, the bent of the main surface of the said gate electrode 312 caused by the reduction of silicon in the said first polycrystalline silicon layer 304 can be prevented.

Therefore, the gate electrode 312 is formed in shape with superior electric characteristics.

Although description was given of a case in which N type diffused layer is formed on the P type substrate 301 and a MOS transistor is formed in the foregoing, the said substrate 301 and the diffused layer may have the opposite conductivity type, and the structure of the device to be formed may be a bipolar transistor, or any other structure.

Although a gate electrode 312 is formed as the conductive layer, other electrodes or interconnections may be available.

The second polycrystalline silicon layer 313 on the conductive layer may be doped polycrystalline silicon or non-doped polycrystalline silicon. Although in the description the second polycrystalline silicon is at first formed to the thickness of about 500 Å and the upper layer portion thereof turns into the silicon oxide film 314 with the polycrystalline silicon layer of about 100 to 200 Å thickness remains after the reflow oxidation, the structure is not limited to this. The same effect can be obtained provided that the said second polycrystalline silicon layer 313 remains after the reflow oxidation. The same effect as in the above described embodiment may be provided if the thickness of the second polycrystalline silicon layer 313 and the thickness of other layers are properly selected in accordance with the heat treatment condition of reflow oxidation and the like.

FIGS. 10A to 10H are schematic cross sectional views showing the manufacturing method in accordance with a still further embodiment of the present invention.

The manufacturing method will be described in the following with reference to the figures.

Figure 10A:
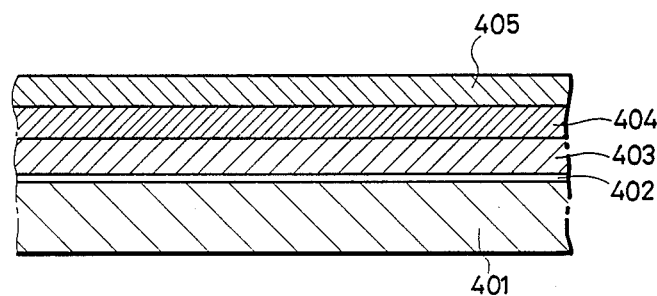
FIG. 10A to 10H are schematic cross sectional views showing the steps of the manufacturing method in accordance with a still further embodiment of the present invention.

First, an oxide film 402 for a polyside gate is formed by thermal oxidation on a main surface of a semiconductor substrate 401 such as a silicon substrate, and a polysilicon 403 is deposited thereon by reduced pressure CVD. A silicide 404 of a metal having high melting point is deposited thereon by sputtering or reduced pressure CVD, and a silicon system material 405 is further deposited thereon by reduced pressure CVD and the like. The silicide comprises tungsten silicide, molybdenum silicide, titanium silicide and the like, while the silicon system material comprises polysilicon, amorphous silicon and the like (FIG. 10A).

Figure 10B:
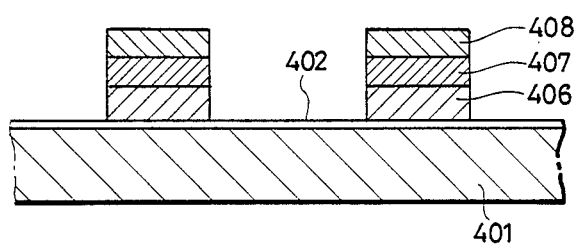

The silicon system material, the silicide 404 of a metal having high melting point and the polysilicon 403 are etched using as a mask a resist pattern (not shown) obtained after resist patterning effected by photolithography technology, whereby a polyside gate comprising a polysilicon pattern 406, silicide pattern 407 and a silicon system material pattern 408 is formed (FIG. 10B).

Figure 10C:
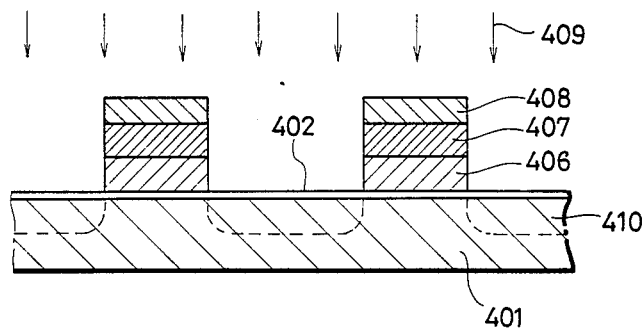
Figure 10D:
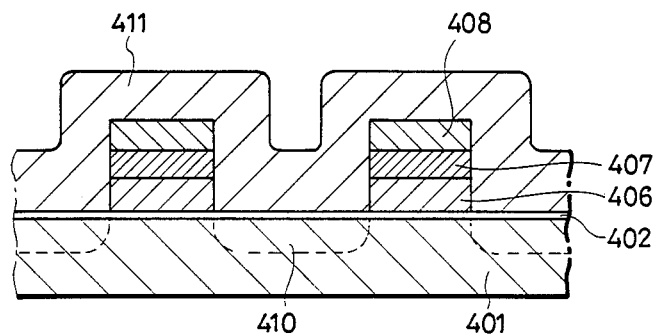

Ion implantation of impurities 409 having the conductivity type opposite to the semiconductor substrate 401 is carried out on the entire main surface of the semiconductor substrate 401 using the polyside gate as a mask, thereby forming an impurity implanted region 410 (FIG. 10C).

Figure 10E:
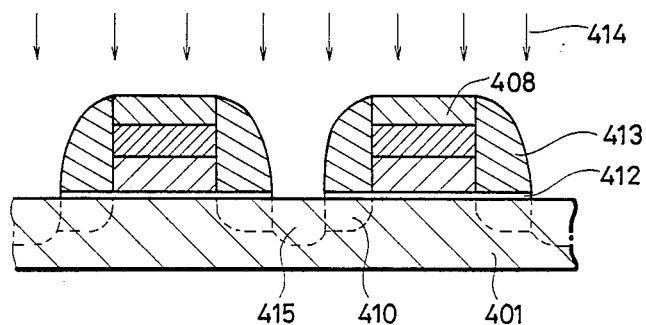

Thereafter, an oxide film 411 is deposited on the entire surface of the semiconductor substrate 401 to cover the polyside gate (FIG. 10D), sidewall oxide films 413 are formed on the side walls of the polyside gate by etch back, and the oxide film 402 is etched to form a gate oxide film 412. Then, ion implantation of impurities 414 having the conductivity type opposite to the semiconductor substrate is carried out entirely on the main surface of the semiconductor substrate 401 to form impurity implanted regions 415. The condition of ion implantation is selected such that the concentration of the impurities in the region 415 becomes higher than that of the region 410 (FIG. 10E).

Thereafter, heat treatment is carried out in the semiconductor substrate 401 to form impurity regions 416 having low impurity concentration and impurity regions 417 having high impurity concentration having the conductivity type opposite to the semiconductor substrate 401 are formed, and these regions constitute, together with the polyside gate, a LDD device.

Figure 10F:
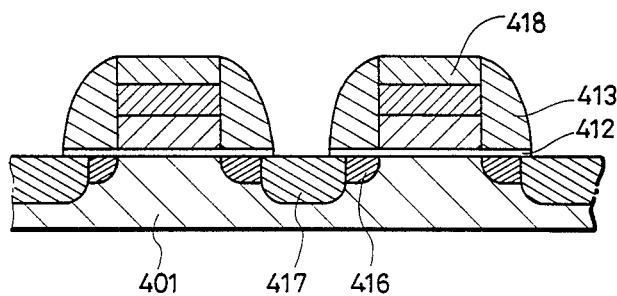

In this heat treatment, the silicon system material pattern 408 reacts with the atoms of oxygen reaching the surface thereof, to turn itself into a silicon oxide film 418. The oxidation reaction prevents the formation of porous oxide film layer on the silicide pattern 407 of a metal having high melting point, so that the degradation of the electric characteristics of the polyside gate transistor, especially the increase of heat resistance of the gate, increase of the contact resistance on the gate from the upper layer interconnections can be prevented (FIG. 10F).

Figure 10G:
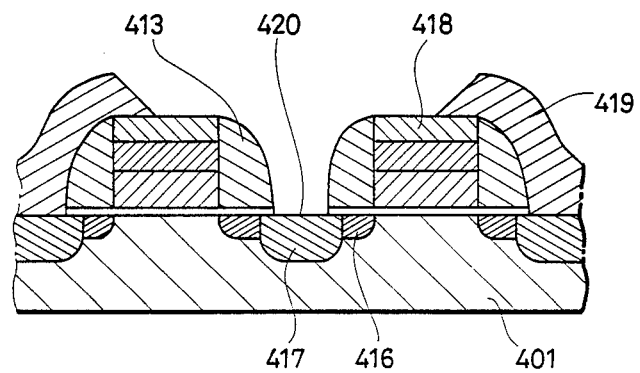
Figure 10H:
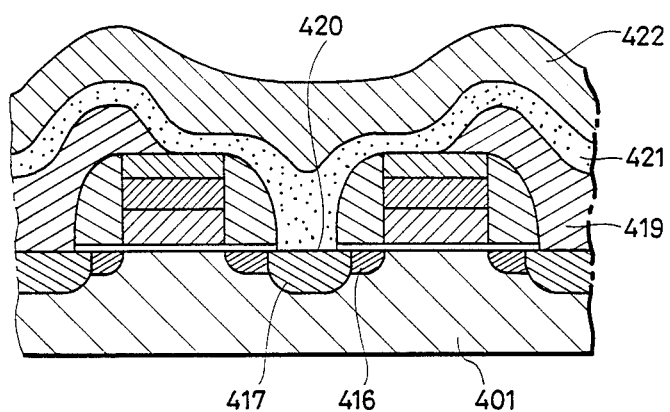

Thereafter, an interlayer insulating film 419 is formed to cover a portion of the silicon oxide film 418 except the contact portion 420 on the impurity region 417 having a prescribed high impurity concentration (FIG. 10G). A polysilicon 421 which will be the interconnection layer and the silicide 422 are formed on the entire surface including the contact portion 420 and patterning is carried out in a prescribed range, whereby the device is completed (FIG. 10H).

Meanwhile, one object of the present invention is to provide a structure which prevents formation of a porous oxide film layer on the silicide of a metal having high melting point in heat treatment for diffusing implanted impurities. Therefore, it goes without saying that the material is not limited to the silicon system material.

An embodiment employing a silicon oxide as the material is disclosed in the following as a still further embodiment.

FIGS. 11A to 11H are schematic cross sectional views showing the manufacturing method in accordance with a still further embodiment of the present invention.

The manufacturing method will be described in the following with reference to the figures.

Figure 11A:
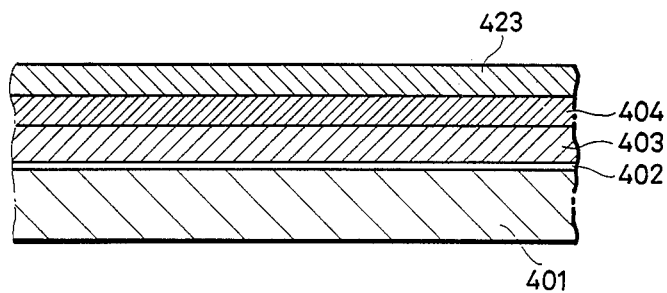
FIGS. 11A to 11H are schematic cross sectional views showing the steps of the manufacturing method in accordance with a still further embodiment of the present invention.
Figure 11B:
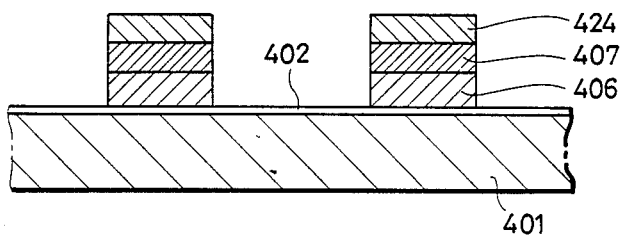

First, an oxide film 402 for a polyside gate is formed by thermal oxidation on a main surface of a semiconductor substrate 401 formed of a silicon substrate and the like, and a polysilicon 403 is deposited thereon by reduced pressure CVD. A silicide 404 of a metal having high melting point is deposited thereon by sputtering or reduced pressure CVD, and a silicon oxide film 423 is deposited further thereon by reduced pressure CVD or the like. The silicide may be tungsten silicide, molybdenum silicide, titanium silicide, and the like (FIG. 11A).

The silicon oxide film 423, the silicide 404 of the metal having high melting point and the polysilicon 403 are etched using as a mask a resist pattern (not shown) obtained by resist patterning effected by photolithography.

Figure 11C:
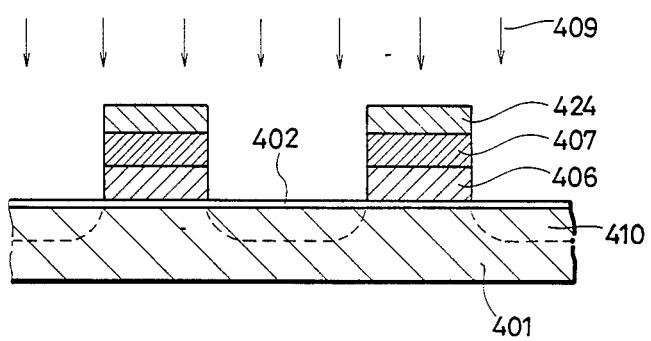
Figure 11D:
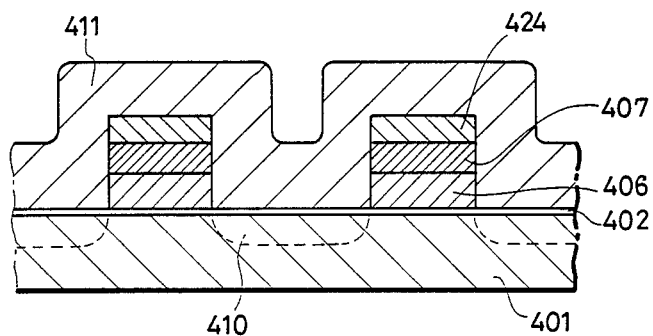

Impurities 409 having the conductivity type opposite to the semiconductor substrate 401 are ion implanted to the entire surface of the semiconductor substrate 401 using the polyside gate as a mask, thereby forming impurity implanted regions 410 (FIG. 11C).

Figure 11E:
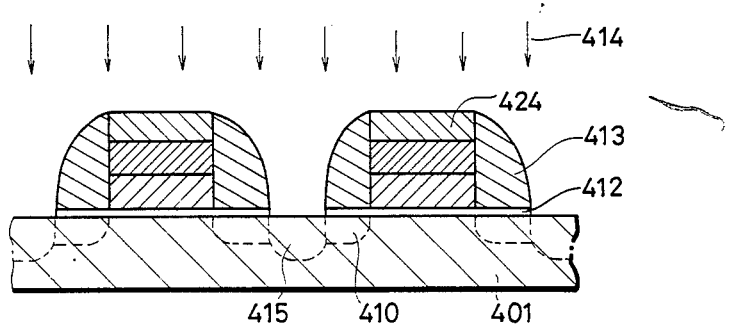

Thereafter, an oxide film 411 is deposited on the entire surface of the semiconductor substrate 401 to cover the polyside gate (FIG. 11D) and etchback is carried out to from sidewall oxide films 413 on the sidewalls of the polyside gate. The oxide film 402 is etched to form a gate oxide film 412 and thereafter, impurities 414 having the conductivity type opposite to the semiconductor substrate 401 is ion implanted on the entire main surface of the semiconductor substrate 401 to form impurity implanted regions 415. The condition of ion implantation is selected such that the impurity concentration of the impurity implanted region 415 becomes higher than that of the region 410 (FIG. 11E).

Figure 11F:
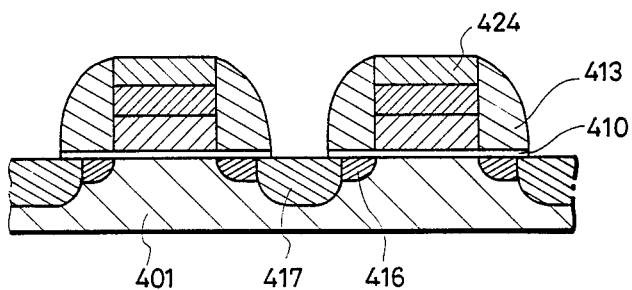

The heat treatment is carried out on the semiconductor substrate 401 to form impurity regions 416 having low impurity concentration and impurity regions 417 having high impurity concentrations of the conductivity type opposite to the semiconductor substrate 401, with these regions constituting, together with the polyside gate, a LDD device (FIG. 11F).

In the heat treatment, the silicon oxide film pattern 424 prevents oxygen atoms from directly reaching the silicide pattern 407 of the metal having high melting point, so that a generation of porous oxide film layer on the silicide pattern 407 of the metal having high melting point caused by the oxidation with the rate determined by the supply of silicon atoms is prevented. Consequently, oxidation reaction on the silicide pattern 407 of the metal having high melting point has its rate-determined by the supply of the oxygen atoms. More specifically, the silicon oxide film pattern 424 changes the oxidation reaction on the silicide pattern 407 of the metal having high melting point from a reaction rate-determined by the supply of silicon to the reaction rate-determined by the supply of oxygen, whereby the formation of a porous oxide film on the silicide pattern 407 of the metal having high melting point can be prevented. As a result, the degradation of the electric characteristics of the polyside gate transistor can be prevented as in the former embodiment.

Figure 11G:
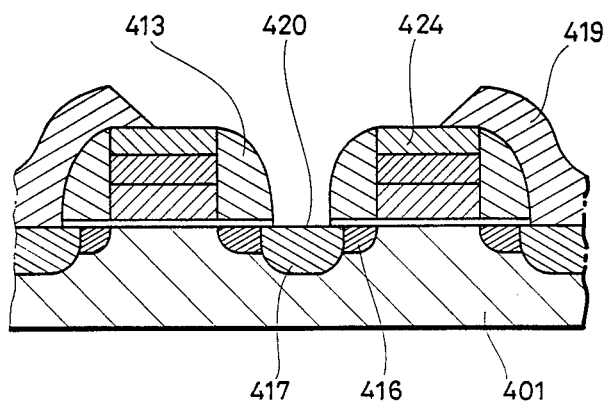
Figure 11H:
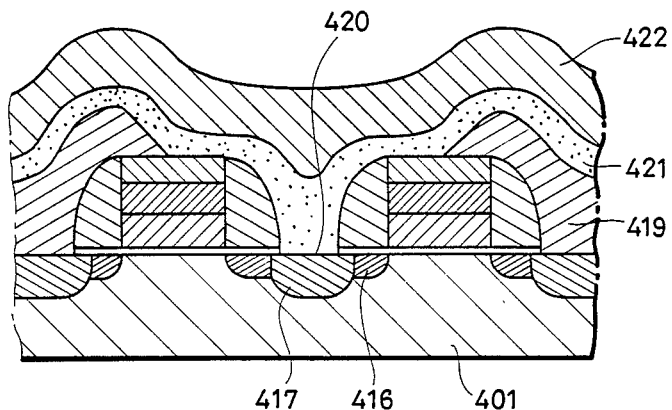

Thereafter, an interlayer insulating film 419 is formed such that it covers a portion of the silicon oxide film pattern 424 except a contact portion 420 on the impurity region 417 having a prescribed high impurity concentration (FIG. 11G). Thereafter, a polysilicon 421 which will be the interconnection layer and a silicide 422 are formed on the entire surface including the contact portion 420 and patterning is carried out in the prescribed range, thereby completing the device (FIG. 11H).

As described above, according to the present invention, the heat treatment in the manufacturing process has no influence on the conductor or on the polyside gate, so that the electric characteristics is not degraded, and the shape thereof is not changed. Therefore, a highly reliable semiconductor device can be provided without especially reducing the temperature of heat treatment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device, comprising the steps of:
   preparing a semiconductor substrate having a main surface;
   forming a conductor including polysilicon on the main surface of said semiconductor substrate;
   forming a protection film for protecting said conductor from an oxidation reaction during a reflow film heat treatment; and
   effecting heat treatment with oxidation reaction on said semiconductor substrate,
   wherein said step of forming the protection film comprises the steps of:
   forming an insulating film on the main surface of said semiconductor substrate to cover said conductor;
   forming said protection film on said insulating film; and
   forming a reflow film for moderating a step at said insulating film on said protection film.

2. A method for manufacturing a semiconductor device according to claim 1, wherein said protecting film is formed on an upper surface of said conductor.

3. A method for manufacturing a semiconductor device according to claim 1, wherein said conductor includes a polyside gate or interconnection.

4. A method for manufacturing a semiconductor device, comprising the steps of:
   preparing a semiconductor substrate having a main surface;
   forming a conductor including polysilicon on the main surface of said semiconductor substrate;
   forming a protection film for protecting said conductor from oxidation reaction; and
   effecting heat treatment with oxidation reaction on said semiconductor substrate, wherein said step of forming the protection film comprises the steps of:
  forming an insulating film on the main surface of said semiconductor substrate to cover said conductor;
  forming said protection film on said insulating film; and
  forming a reflow film for moderating a step at said insulating film on said protection film.
  wherein said insulating film includes a silicon oxide film, said protection film includes a polysilicon film, and said protection film is integrated with said insulating film by said heat treatment.

5. A method for manufacturing a semiconductor device, comprising the steps of:
  preparing a semiconductor substrate having a main surface;
  forming a polyside gate of a prescribed shape on said main surface of said semiconductor substrate;
  thereafter forming a protection film on said polyside gate for protecting an upper surface of said polyside gate from oxidation reaction in a reflow process heat treatment hereby to reduce shape degradation of said polyside gate during said reflow process heat treatment;
  implanting a first impurity in said semiconductor substrate using said polyside gate and said protection film as a mask; and
  heat treating said implanted first impurity to diffuse the same in said semiconductor substrate forming an interlayer insulating film on the main surface of said semiconductor substrate to cover said polyside gate on which said protection film is formed;
  forming a reflow film on said interlayer insulating film for moderating a step at said interlayer insulating film;
  reflow processing said device by heat treating said reflow film in an oxygen atmosphere; and
  forming an interconnection layer of a prescribed shape on said heat treated reflow film.

6. A method for manufacturing a semiconductor device according to claim 5, wherein said protection film is a film comprising a silicon system material consisting of polysilicon or amorphous silicon.

7. A method for manufacturing a semiconductor device according to claim 5, wherein said protecting film comprises a silicon oxide film.

8. A method for manufacturing a semiconductor device according to claim 5, which further comprises the steps of:
  forming a sidewall oxide film on a sidewall of said polyside gate and said protection film; and
  implanting a second impurity in said semiconductor substrate using said protection film and said sidewall oxide film as a mask; wherein
  concentration of said second impurity is higher than that of said first impurity.

9. A method for manufacturing a semiconductor device according to claim 8, wherein said step of diffusing said first impurity comprises the step of simultaneously diffusing said implanted second impurity.

10. A method for manufacturing a semiconductor device according to claim 9, wherein said step of diffusing said first impurity comprises the step of diffusing said implanted first and second impurities to form an impurity region of low concentration and an impurity region of high concentration.

11. A method for manufacturing a semiconductor device according to claim 10, wherein said polyside gate, said impurity region of low concentration and said impurity region of high concentration constitute a LDD (Lightly Doped Drain) device.

12. A method for manufacturing a semiconductor device according to claim 11, wherein said step of forming an interlayer insulating film comprises forming said interlayer insulating film to cover a portion of said protection film except a prescribed region of said impurity region of high concentration; and said step of
  forming an interconnection layer comprises forming said interconnection layer to cover said expose impurity region of high concentration, a portion of said sidewall oxide film and said protection film and said interlayer insulating film.

13. A method for manufacturing a semiconductor device according to claim 12, wherein said interconnection layer includes a polyside structure.

14. A method for manufacturing a semiconductor device according to claim 5, wherein a silicide constituting said polyside gate comprises a silicide of a metal having high melting point.

15. A method for manufacturing a semiconductor device according to claim 14, wherein said silicide of a metal having high melting point is selected from a group consisting of tungsten silicide, molybdenum silicide and titanium silicide.

16. A method for manufacturing a semiconductor device according to claim 5, wherein said interlayer insulating film comprises a silicon oxide film, said reflow film comprises BPSG or PSG, and said interconnection layer comprises aluminum.

17. A method for manufacturing a semiconductor device according to claim 5, which further comprises the steps of:
  forming a sidewall oxide film on a sidewall of said polyside gate and said protection film; and
  implanting a second impurity in said semiconductor substrate using said protection film and said sidewall oxide film as a mask; wherein
  concentration of said second impurity is higher than that of said first impurity.

18. A method for manufacturing a semiconductor device, comprising the steps of:
  preparing a semiconductor substrate having a main surface;
  forming a polyside gate of a prescribed shape on the main surface of said semiconductor substrate;
  forming an interlayer insulating film on the main surface of said semiconductor substrate to cover said polyside gate;
  forming a protection film on said interlayer insulating film for protecting said polyside gate from an oxidation reaction during a heat treatment in a reflow film smoothing step;
  forming a reflow film on said protection film for moderating a step at said interlayer insulating film; and
  smoothing a surface of said reflow film by heat treatment.

19. A method for manufacturing a semiconductor device according to claim 18, wherein said protection film comprises a film of a silicon system material comprising polysilicon or amorphous silicon.

20. A method for manufacturing a semiconductor device according to claim 18, wherein said method of forming said polyside gate comprises the steps of:
  implanting a first impurity in said semiconductor substrate using said polyside gate as a mask; and heat treating said first implanted impurity to diffuse the same in said semiconductor substrate.

21. A method for manufacturing a semiconductor device according to claim 20, which further comprises the steps of:
forming a sidewall oxide film on a sidewall of said polyside gate;
implanting a second impurity in said semiconductor substrate using said polyside gate and said sidewall oxide film as a mask; wherein
concentration of said second impurity is higher than that of said first impurity, and said implanted second impurity as well as said implanted first impurity is diffused by said heat treatment.

22. A method for manufacturing a semiconductor device according to claim 21, wherein said step of diffusing said first impurity comprises the step of diffusing said implanted first and second impurities to form an impurity region of a low concentration and an impurity region of high concentration.

23. A method for manufacturing a semiconductor device according to claim 22, wherein said polyside gate, said impurity region of low concentration and said impurity region of high concentration constitute a LDD (Lightly Doped Drain) device.

24. A method for manufacturing a semiconductor device according to claim 18, wherein a silicide constituting said polyside gate comprises a silicide of a metal having high melting point.

25. A method for manufacturing a semiconductor device according to claim 24, wherein said silicide of a metal having high melting point is selected from a group consisting of tungsten silicide, molybdenum silicide and titanium silicide.

* * * * *